(12) United States Patent
Mochizuki et al.

(10) Patent No.: US 7,129,469 B2
(45) Date of Patent: Oct. 31, 2006

(54) PHOTODETECTORS, OPTICAL MODULES, AND OPTICAL TRANSMISSION DEVICES

(75) Inventors: Masamitsu Mochizuki, Chino (JP); Tomoko Koyama, Hara-mura (JP); Hajime Onishi, Chino (JP)

(73) Assignee: Seiko Epson Corporation, Tokyo (JP)

( * ) Notice: Subject to any disclaimer, the term of this patent is extended or adjusted under 35 U.S.C. 154(b) by 160 days.

(21) Appl. No.: 10/976,767

(22) Filed: Nov. 1, 2004

(65) Prior Publication Data

US 2005/0145779 A1    Jul. 7, 2005

(30) Foreign Application Priority Data

Nov. 13, 2003  (JP) .............................. 2003-383733

(51) Int. Cl.
*G06F 1/03* (2006.01)
*G06F 1/07* (2006.01)

(52) U.S. Cl. .................... 250/226; 359/248; 250/214.1

(58) Field of Classification Search ............ 250/214.1, 250/226; 359/248, 590
See application file for complete search history.

(56) References Cited

U.S. PATENT DOCUMENTS 6,396,617 B1 *   5/2002   Scalora ..................... 359/248

FOREIGN PATENT DOCUMENTS

JP        A 05-315637        11/1993

OTHER PUBLICATIONS

"A Novel HMSM Photodetector with Resonant Cavity for Short Haul Communications" by Xiying Chen, et al.; IEEE MTT-S Digest, pp. 1281-1284, 2002.
"High-Frequency, High-Efficiency MSM Photodetectors" by Jinwook Burm, et al.; IEEE Journal of Quantum Electronics, vol. 31, No. 8, pp. 1504-1509, Aug. 1995.

* cited by examiner

*Primary Examiner*—Thanh X. Luu
*Assistant Examiner*—Tony Ko
(74) *Attorney, Agent, or Firm*—Oliff & Berridge, PLC

(57) ABSTRACT

A method is provided to provide a photodetector that can enhance the light receiving sensitivity with a relatively simple structure, and that can maintain a high speed responsiveness. A photodetector having a MSM (Metal-Semiconductor-Metal) structure, including a substrate, a multilayer film that is disposed over the substrate and includes a low refractive index layer and a high refractive index layer that are alternately laminated as a unit cycle. At least one of the low refractive index layer and the high refractive index layer is a photoabsorption layer composed of semiconductor, and a portion that is embedded in the multilayer film, the portion having at least one pair of opposing electrodes within the multilayer film. The multilayer film is formed such that a wavelength region corresponding to a band edge of a photonic band overlaps at least a part of an absorption band of the photoabsorption layer, to thereby delay a group velocity of incidence light Pin with a predetermined wavelength that belongs to the absorption band of the photoabsorption layer.

11 Claims, 12 Drawing Sheets

PHOTODETECTORS, OPTICAL MODULES, AND OPTICAL TRANSMISSION DEVICES

RELATED APPLICATIONS

The present application claims priority to Japanese Patent Application No. 2003-383733 filed Nov. 13, 2003 which is incorporated by reference in its entirety.

BACKGROUND OF THE INVENTION

1. Field of Invention

Exemplary aspects of the present invention relate to photodetectors, optical modules and optical transmission devices having a MSM (Metal-Semiconductor-Metal) structure.

2. Description of Related Art

A related art MSM type photodiode uses a comb-shaped electrode to apply a high electric field with a low voltage to a photoabsorption layer, and realizes a high-speed responsiveness with its short traveling distance of electrons. For this reason, the MSM type photodiodes are promising as photodetectors in optical transmission devices, optical interconnection, etc.

SUMMARY OF THE INVENTION

However, because the MSM type photodiode has a structure in which its light receiving surface is covered with the electrode, it is difficult to obtain a high photodetecting sensitivity. Therefore, many devices have been made to obtain a higher photodetecting sensitivity, for example, by providing a photoabsorption layer with a super-lattice structure, providing a photoabsorption layer at its lower side with a distributed Bragg reflection film (DBR) structure, and the like. However, when the super-lattice structure is used, the thickness of each of the layers becomes very thin by the mismatch in the lattice constants of the materials. Therefore, a considerable number of layers are needed in the super-lattice structure to obtain enough sensitivity. Thus the number of manufacturing steps increases. Also, a wavelength spectral separation structure cannot be built into the one having the DBR structure that is provided in the lower side of the photoabsorption layer, though it is excellent in the photodetecting sensitivity. This is because all light rays in a relatively wide wavelength region are reflected when the reflection film is used. Therefore, when light rays with a plurality of wavelengths are multiplexed in incidence light, it is necessary to separately provide a wavelength spectral separation device, which results in an increase in the manufacturing steps as the number of components increases, and causes a demand concerning the alignment accuracy among devices.

Exemplary aspects of the present invention have made in view of the considerations discussed above, and provide a photodetector that has a high photodetecting sensitivity with a relatively simple structure, and can maintain a high-speed responsiveness. Further, exemplary aspects of the present invention provide an optical module using the photodetector described above, and an optical transmission device that uses the optical module.

Exemplary aspects of the present invention relate to a photodetector having a MSM (Metal-Semiconductor-Metal) structure. The photodetector includes: a substrate; a multilayer film that is disposed over the substrate and includes a low refractive index layer and a high refractive index layer that are alternately laminated as a unit cycle. At least one of the low refractive index layer and the high refractive index layer is a photoabsorption layer composed of semiconductor and a portion that is embedded in the multilayer film, the portion having at least one pair of opposing electrodes within the multilayer film. The multilayer film is formed such that a wavelength region corresponding to a band edge of a photonic band overlaps at least a part of an absorption band of the photoabsorption layer, to thereby delay a group velocity of incidence light with a predetermined wavelength that belongs to the absorption band of the photoabsorption layer.

According to an exemplary aspect of the present invention, the multilayer film has a one-dimensional photonic crystal structure due a cyclic structure of the high refractive index layers and the low refractive index layers. A photonic band gap, that prohibits the propagation of light in a certain wavelength region, is created in the direction in which the layers are stacked. In the photonic crystal structure, the density state of photons rise and the group velocity is delayed in a band edge of a photonic band. Specifically, in accordance with an exemplary aspect of the present invention, the multilayer film is introduced as an optical delaying film, which is provided with a function to absorb light, whereby the time that light stays in the photoabsorption layer is extended to several times longer than usual or greater, such that the sensitivity can be enhanced. Also, in accordance with an exemplary aspect of the present invention, the photodetector has a MSM structure, such that the advancing direction of light and the traveling direction of electrons are arranged in different directions. Accordingly, electrons travel in the semiconductor layer, which has a relatively low-resistance. Therefore a high-speed responsiveness can be sufficiently maintained.

In the photodetector in accordance with an exemplary aspect of the present invention, a plurality of the multilayer films are stacked on the substrate. A plurality of the electrodes are provided for the plurality of the multilayer films, and the plurality of the multilayer films are formed such that band edges of photonic bands thereof differ from one another to delay group velocities of light with mutually different wavelengths. The effect of lowering group velocity of light in the photonic crystal structure is realized through multiple reflection of incidence light within the multilayer film. Therefore, only specific wavelengths determined by the number of unit cycles and the thickness of the multilayer film are strongly influenced by the group velocity lowering effect. Specifically, the plurality of multilayer films in accordance with the present exemplary embodiment are formed such that band edges of the respective photonic bands differ from one another, and therefore each have a different wavelength region that is highly sensitive for light rays having wavelengths that strongly receive the group velocity lowering effect, i.e., a so-called wavelength-selectivity. Accordingly, in accordance with the present exemplary embodiment, each of the multilayer films more readily transmits light with wavelengths other than the selected wavelengths, compared to light with the selected wavelengths, so that, even when incidence light includes light rays with multiple wavelengths, the light rays can be received while being spectrally separated by each of the multilayer films.

In the photodetector in accordance with an exemplary aspect of the present invention, ends of photonic band gaps in a long-wavelength side of the plurality of multilayer films may shift in stages toward the long-wavelength side from a light incidence surface side to the side of the substrate. By so doing, when light rays with a plurality of different wavelengths are included in incidence light, those of the light rays with shorter wavelengths can be absorbed by the multilayer films successively from the light incidence surface side to the substrate side.

In the photodetector in accordance with an exemplary aspect of the present invention, ends of the photonic band gaps in a short-wavelength side of the plurality of multilayer films may shift in stages toward the short-wavelength side from the light incidence surface side to the substrate side. By so doing, when light rays with a plurality of different wavelengths are included in incidence light, those of the light rays with longer wavelengths can be absorbed by the multilayer films successively from the light incidence surface side to the substrate side.

In the photodetector in accordance with an exemplary aspect of the present invention, an end layer of the multilayer film on the light incidence surface side may be the low refractive index layer, and the end layer may be formed to have a layer thickness that is set so as not to reflect the incidence light. By so doing, the end layer of the multilayer film provided on the light incidence surface side functions as an anti-reflection coat layer, such that front reflection of the incidence light can be reduced or prevented, and much of the incidence light can be taken in the device.

In the photodetector in accordance with an exemplary aspect of the present invention, the photoabsorption layer may be formed from indirect transition type semiconductor. By so doing, photoabsorption of wavelengths with a few delays in the group velocity can be reduced, and therefore it is particularly useful when multilayer films with different absorbing wavelengths are provided in multiple stages.

In the photodetector in accordance with an exemplary aspect of the present invention, the low refractive index layer may be formed from either oxide or nitride. There are many oxides and nitrides with a low refractive index. Therefore, if the multilayer film is formed by using one of them, the refractive index difference with the photoabsorption layer composed of semiconductor can be made greater, and the effect of delaying the group velocity of light can be obtained by a relatively small number of multilayer films.

The photodetector in accordance with an exemplary aspect of the present invention may further include a multilayer reflection film between the multilayer film and the substrate. By so doing, even if there are light rays that pass without being absorbed by the multilayer films, returning light from the multilayer reflection film can be absorbed by the multilayer films. Thus the light receiving efficiency can be enhanced.

In the photodetector in accordance with an exemplary aspect of the present invention, the electrodes may have a planar configuration in a comb shape. As a result, the distance between the electrodes can be shortened, and their opposing area can be increased, such that a high-speed responsiveness can be obtained, and the light receiving efficiency can be enhanced.

Also, exemplary aspects of the present invention can be applied to an optical module including any one of the photodetectors described above, and to an optical transmission device using the optical module.

DETAILED DESCRIPTION OF EXEMPLARY EMBODIMENTS

Exemplary embodiments of the present invention are described below with reference to the accompanying drawings.

1. Photodetector and Its Manufacturing Method

Figure 1A:
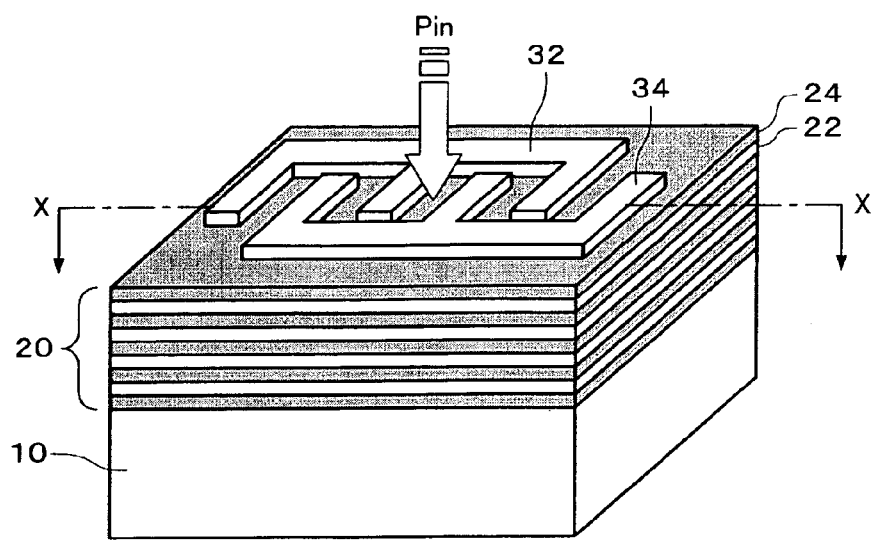
FIGS. 1A and 1B show a schematic and a cross-sectional schematic showing a photodetector in accordance with an exemplary embodiment of the present invention.
Figure 1B:
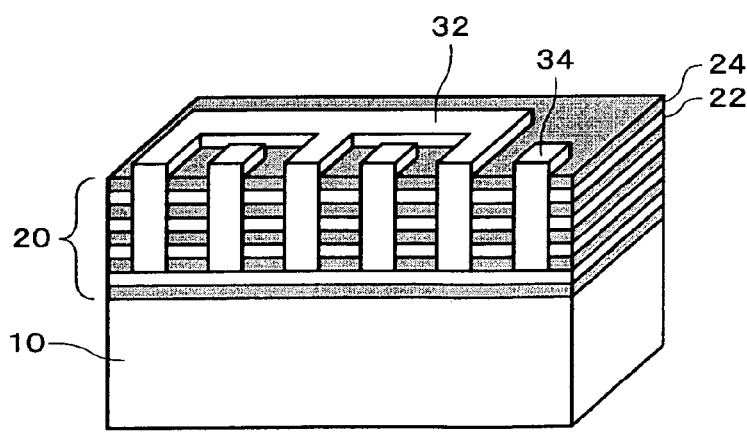

FIG. 1A is a schematic showing a photodetector in accordance with an exemplary embodiment of the present invention. FIG. 1B is a schematic taken along a plane X—X of FIG. 1A.

The photodetector of the present exemplary embodiment is a MSM type photodiode that includes a multilayer film 20 arranged on a semiconductor substrate 10, as shown in FIG. 1A, and includes an embedded section in the multilayer film 20. The section is composed of a pair of electrodes 32 and 34 opposing to each other inside the multilayer film 20, as shown in FIG. 1B. The photodetector defines a light incidence surface where the pair of electrodes 32 and 34 are exposed through the multilayer film 20, receives incidence light Pin through the light incidence surface, and detects the light with the multilayer film 20.

The electrodes 32 and 34 may be composed of metal and have a comb-shaped planar configuration. As a result, the distance between the electrodes can be shortened, and the opposing area thereof can be increased, such that a high-speed responsiveness can be obtained, and the light receiving efficiency can be enhanced.

The photodetector in accordance with the present exemplary embodiment may be provided with a multilayer reflection film at a lower section of the multilayer film 20 (or between the multilayer film 20 and the substrate 10). By so doing, returning light from the multilayer reflection film can be absorbed by the multilayer film 20, and thus the light receiving efficiency can be improved.

In order to take the incidence light Pin in the multilayer film 20 as much as possible, it is effective to reduce or prevent front reflection of the incidence light Pin at the light incident surface. In this respect, for example, an end layer of the multilayer film 20 on the light incidence surface side may be formed from a low refractive index layer 24. The end layer may be formed to have a layer thickness that is set so as not to reflect the incidence light Pin. When the refractive index of the low refractive index layer 24 is assumed to be $n_1$, and the wavelength of the incidence light Pin is assumed to be $\lambda$, the layer thickness of the end layer can be set to be $\lambda/4n_1$. Also, when the incidence light Pin enters from air (refractive index $n_0=1.0$), and the refractive index of a high refractive index layer 22 is assumed to be $n_2$, it is preferable that the relation, $n_0 < n_1 < n_2$, and $n_1 \approx \sqrt{n_0}/n_2 = \sqrt{n_2}$, may be established.

The multilayer film 20 has a one-dimensional photonic crystal structure in which the high refractive index layer 22 and the low refractive index layer 24 defining a unit cycle are alternately stacked in layers in multiple cycles. The high refractive index layers 22 may be formed by using semiconductor material corresponding to a specified absorption band, such as, for example, Si, Ge, GaAs, InGaAs, and GaInNAs, such that they can function as a photoabsorption layer. In particular, a compound semiconductor of three or more elements can be formed to have different band gap energy by adjusting its chemical composition. Therefore it is suitable to form a photoabsorption layer by setting the absorption band to match with the structure of a photonic band of the multilayer film 20. The low refractive index layers 24 can be formed with an insulation material, such as, for example, an oxide including $SiO_2$, $Al_xO_y$, etc., and a nitride including SiN, etc. The multilayer film 20, without being limited to the case where the high refractive index layer 22 becomes a photoabsorption layer, can be formed such that the low refractive index layer 24 may become a photoabsorption layer. Moreover, the multilayer film 20, without being limited to the case where either the high refractive index layer 22 or the low refractive index layer 24 becomes a photoabsorption layer, can be formed such that both of the layers have the photoabsorption function.

Figure 2A:
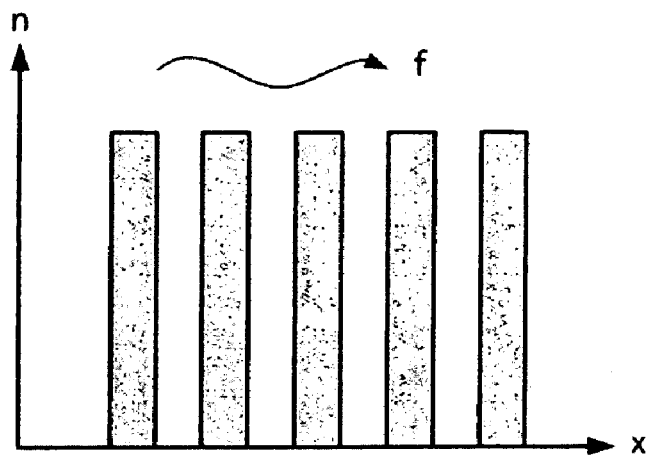
FIGS. 2A and 2B show schematics for describing a photonic band structure of a multilayer film.
Figure 2B:
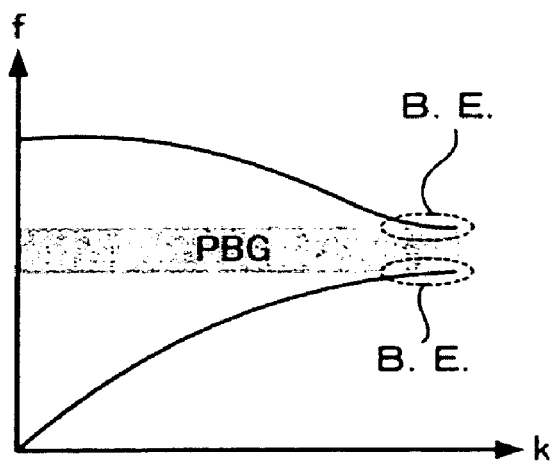

The multilayer film, that has a periodic refractive index distribution shown in FIG. 2A, generally has a photonic band structure shown in FIG. 2B. Such a periodic refractive index distribution is called a one-dimensional photonic crystal, and has a photonic band gap PBG formed therein which cannot propagate or even does not permit existence of light in a specific frequency region (wavelength region). At the band edge B.E. of the photonic band in a band dispersion curve shown in FIG. 2B, light progresses gradually while repeating multiple reflection, such that the time the light stays in the multilayer film 20 becomes longer and the group velocity of the light becomes lower. In the band dispersion curve that represents the structure of the photonic band, the slope of the curve indicates the magnitude of the group velocity, and the more the curve approaches the band gap PBG, the smaller the inclination becomes. Specifically, the group velocity of light in a wavelength region that corresponds to the band edge B.E. of the photonic band delays in the multilayer film, compared to light in other wavelength regions.

The photodetector in accordance with the present exemplary embodiment is formed such that the delaying wavelength region corresponding to the band edge of the photonic band with respect to the multilayer film 20 overlaps at least a part of the absorption band of the photoabsorption layer which is realized by either the high refractive index layers 22 or the low refractive index layers 24. As a result, when light having wavelengths that belong to both of the delay wavelength region and the absorption band is assumed to be incidence light Pin, the time that the incidence light Pin stays in the multilayer film 20 can be extended, by the group velocity delaying effect that uses the band edge of the photonic band of the multilayer film 20, to several times longer or more than the time achieve by an ordinary MSM type photodiode. Accordingly, much of the light can be absorbed by the photoabsorption layer that is formed from at least one of the high refractive index layers 22 and the low refractive index layers 24, such that the photodetecting sensitivity can be enhanced.

The multilayer film 20 in the photodetector of the present exemplary embodiment has the function to delay the group velocity of light with predetermined wavelengths and the function to absorb light, such that the photodetecting efficiency can be greatly enhanced compared to a related art MSM type photodiode. In particular, in accordance with the present exemplary embodiment, by forming the low refractive index layers 24 with an oxide or a nitride, and forming the high refractive index layers 22 as photoabsorption layers composed of semiconductor material, the difference in the refractive index between the two can be made greater. Therefore a sufficient group velocity delaying effect can be obtained without increasing the number of unit cycles of the multilayer film 20. Further, because the photodetector of the present exemplary embodiment can be realized with a simple structure, it requires a relatively few manufacturing steps and can reduce the consumption of the resources.

Also, the photodetector in accordance with the present exemplary embodiment is a MSM type photodiode, such that the advancing direction of light incident on the multilayer film 20 and the traveling direction of electrons generated by photoabsorption are different from each other. Accordingly, electrons travel in the photoabsorption layer side that is formed from the high refractive index layers 22 of a relatively low resistance composed of semiconductor material, among the high refractive index layers 22 and the low refractive index layers 24, such that a high-speed responsiveness can be maintained.

Also, the effect of delaying group velocity of light created at the band edge of the photonic band is realized through multiple reflection of light within the multilayer film 20. Therefore, only specific wavelengths that are determined by the length of unit cycle and the number of unit cycles in the multilayer film 20 are strongly influenced by the group velocity delaying effect created at the band edge. By providing a plurality of the multilayer films 20 having different photonic bands, the sensitivity of only wavelengths that strongly receive the group velocity delaying effect is enhanced, such that a photodetector having wavelength selectivity can be realized. In this case, light with selected wavelengths that are determined by each of the multilayer films is absorbed in the photoabsorption layer that is composed of at least one of the high refractive index layers 22 and the low refractive index layers 24, and light with wavelengths other than the selected wavelengths would be readily transmitted. In this manner, in accordance with the present exemplary embodiment, even when incidence light Pin includes light with a plurality of mutually different wavelengths, a device, that can preferentially receive light with selected wavelengths by each of the multilayer films while spectrally separating the wavelengths, can be realized.

Figure 3:
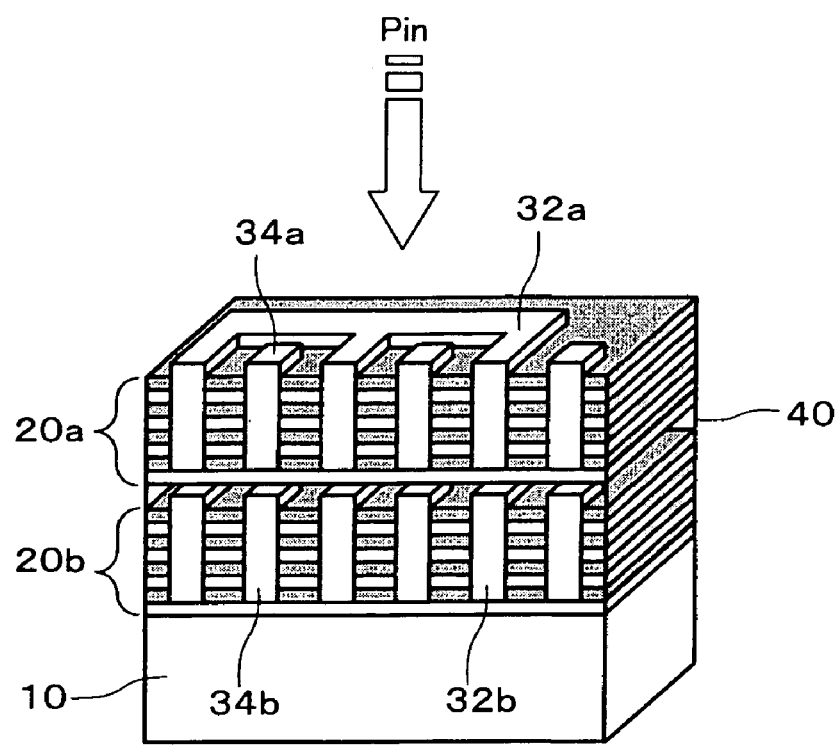
FIG. 3 is a schematic showing an example application of a photodetector of the present exemplary embodiment.
Figure 4A:
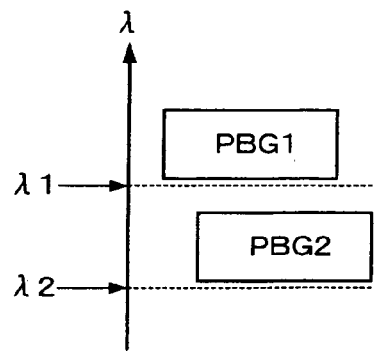
FIGS. 4A–4D show schematics for describing photonic band structures of multilayer films.
Figure 4B:
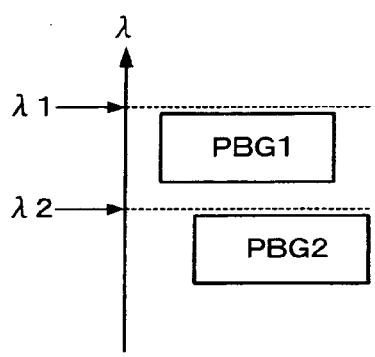
Figure 4C:
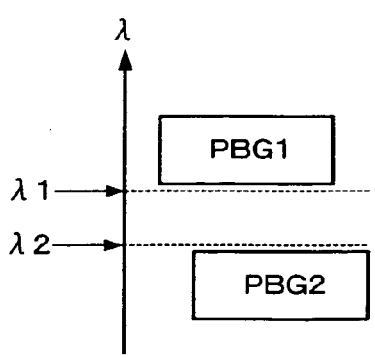
Figure 4D:
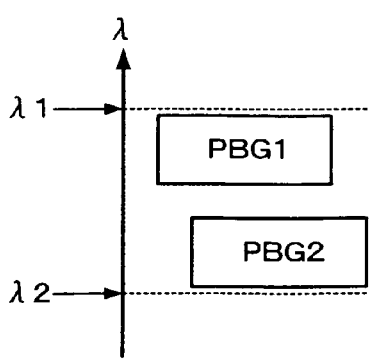

FIG. 3 shows an example of a layer structure which receives each wavelength, when light with two different wavelengths is included in incidence light Pin. The photodetector is formed such that the band edges of photonic bands are mutually different between a first multilayer film 20a and a second multilayer film 20b, and can receive the multiple different wavelengths included in the incidence light Pin while spectrally separating the wavelengths. A separation layer 40 that is composed of insulating material, as shown in FIG. 3, may be provided between the first multilayer film 20a and the second multilayer film 20b. Moreover, FIG. 3 shows an example in which a pair of electrodes 32a and 34a and a pair of electrodes 32b and 34b are provided for each of the multilayer films 20a and 20b. However, one of the electrodes may be formed as a common electrode for both of the multilayer films. Also, when incidence light Pin including light with a plurality of wavelengths is to be received and spectrally separated, each of the multilayer films is formed such that the number of unit cycles and the thickness thereof are different for each of the multilayer films, or material composition of the photoabsorption layer may be changed to change the refractive index thereof. Also, a structure to receive and spectrally separate light with three or more different wavelengths may be realized based on an idea similar to the idea described above to receive and spectrally separate two different wavelengths.

To receive and spectrally separate light, the first multilayer film 20a and the second multilayer film 20b may be designed such that the films are in the following photonic band gap relations. FIG. 4A–FIG. 4D show modes of wavelengths $\lambda 1$ and $\lambda 2$ of received light rays when wavelength regions that respectively correspond to a photonic band gap PBG1 of the first multilayer film 20a and a photonic band gap PBG2 of the second multilayer film 20b are formed not to overlap at all. In this case, the wavelength $\lambda 1$ of light that should be absorbed by the first multilayer film 20a and the wavelength $\lambda 2$ of light that should be absorbed by the second multilayer film 20b can use a band edge on either the long wavelength side or the shorter wavelength side of the photonic band of each of the multilayer films. As long as the wavelength regions corresponding to the photonic band gap PBG1 of the first multilayer film 20a and the photonic band gap PBG2 of the second multilayer film 20b do not overlap each other, the degree of freedom in setting the absorption wavelength regions can be increased. Although the edge of the photonic band gap shifts toward the short wavelength side from the light incidence surface side to the substrate side in FIG. 4A–FIG. 4D, the edge of the photonic band gap may similarly shift toward the long wavelength side from the light incidence surface side to the substrate side. As a result, among the incidence light, only light having a specific wavelength whose group velocity is delayed is absorbed by each of the corresponding multilayer films successively from the long wavelength side or from the short wavelength side, and light in the remaining wavelength regions is transmitted, which realizes a photodetector that spectrally separates and receives incidence light including a plurality of mutually different wavelengths.

Figure 5A:
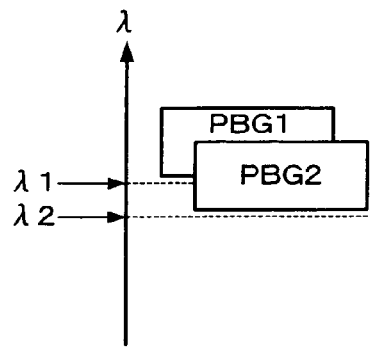
FIGS. 5A–5D show schematics for describing photonic band structures of multilayer films.
Figure 5B:
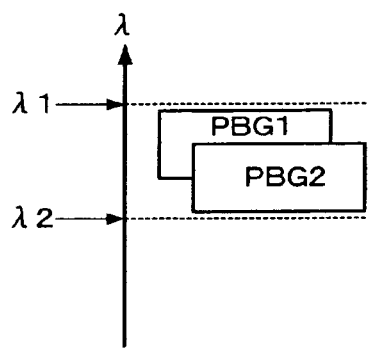

Next, referring to FIG. 5A–FIG. 5D, descriptions are made as to cases where wavelength regions corresponding to the photonic band gap PBG1 of the first multilayer film 20a and the photonic band gap PBG2 of the second multilayer film 20b partially overlap each other. FIG. 5A–FIG. 5D show the cases where the edge of the photonic band gap shifts toward the short wavelength side. But the method described below can be similarly applied to the case where it shifts toward the long wavelength side. First, as shown in FIG. 5A, the band edge of the photonic band on the shorter wavelength side of the first multilayer film 20a is assumed to be an absorption wavelength $\lambda 1$. The band edge of the photonic band on the shorter wavelength side of the second multilayer film 20b is assumed to be an absorption wavelength $\lambda 2$. In this case, light with the wavelength $\lambda 1$ is absorbed by the first multilayer film 20a, and even if a part of the light with the wavelength $\lambda 1$ passes the first multilayer film 20a, it can be reflected by the photonic band gap PBG2 of the second multilayer film 20b and absorbed again by the first multilayer film 20a. Because the group velocity of light with the wavelength $\lambda 2$ is not delayed in the first multilayer film 20a, the light passes the first multilayer film 20a almost without being absorbed and enters the second multilayer film 20b. Since the second multilayer film 20b is formed such that the light with the wavelength $\lambda 2$ is included in the band edge of the photonic band, its group velocity is delayed and it is absorbed efficiently. In the case of FIG. 5B, unlike the case shown in FIG. 5A, when a part of the light with the wavelength $\lambda 1$ is transmitted through the first multilayer film 20a, it cannot be returned to the first multilayer film 20a by reflecting it by the photonic band gap PBG2 of the second multilayer film 20b. However, the light with the wavelengths $\lambda 1$ and $\lambda 2$ can be successively absorbed by the first and second multilayer films 20a and 20b.

Figure 5C:
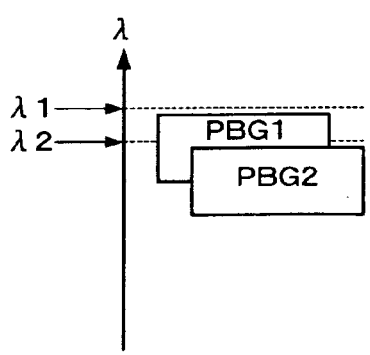
Figure 5D:
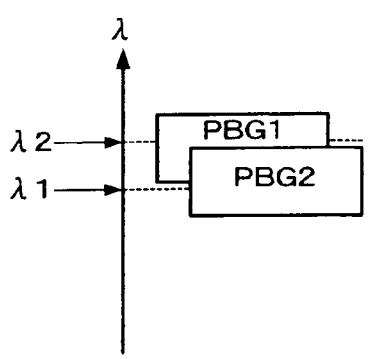

However, if the relations among the photonic band gaps PBG1 and PBG2 of the first and second multilayer films 20a and 20b, and the absorption wavelengths $\lambda 1$ and $\lambda 2$ are set as shown in FIG. 5C and FIG. 5D, the light with the wavelengths $\lambda 1$ and $\lambda 2$ cannot be received while spectrally separating the same. This is because, in these cases, the light with the wavelength $\lambda 2$ in either of the cases is reflected by the photonic band gap PBG1 of the first multilayer film 20a, and cannot be taken in the multilayer films. Even in these cases, light can be spectrally separated and received without a problem if the stacking order of the layers of the multilayer films as viewed from the light incidence surface side is reversed. Accordingly, when a plurality of multilayer films are provided, it is necessary to give a good consideration of the relation between the absorption wavelength region and the stacking sequence of layers when photonic band gaps partially overlap one another.

Next, by taking the photodetector shown in FIG. 1 as an example, a method of manufacturing the device is described.

Figure 6A:
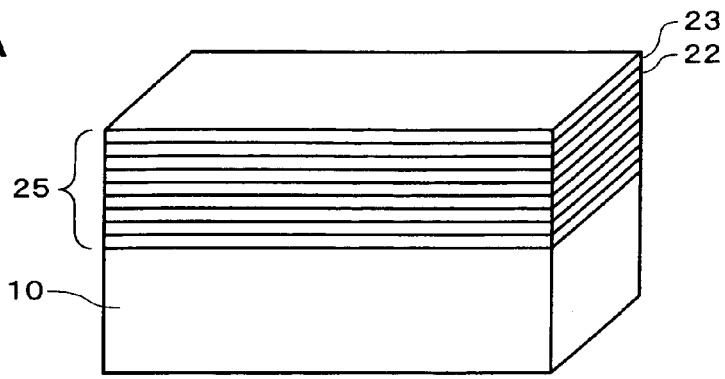
FIGS. 6A–6D show schematics illustrating manufacturing a photodetector in accordance with an exemplary embodiment of the present invention.
Figure 6B:
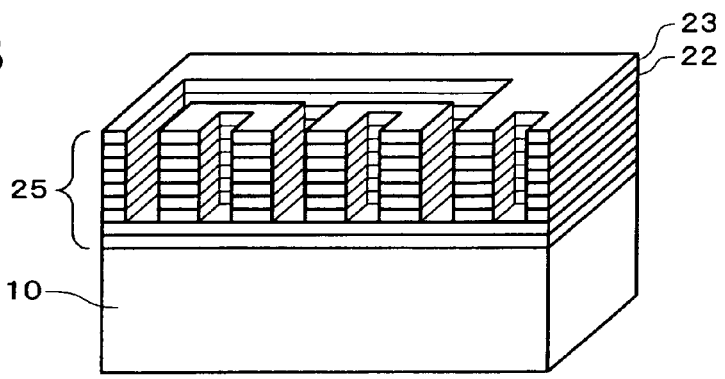
Figure 6C:
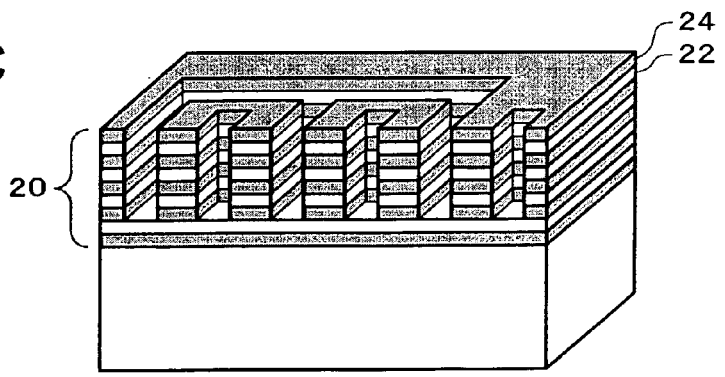
Figure 6D:
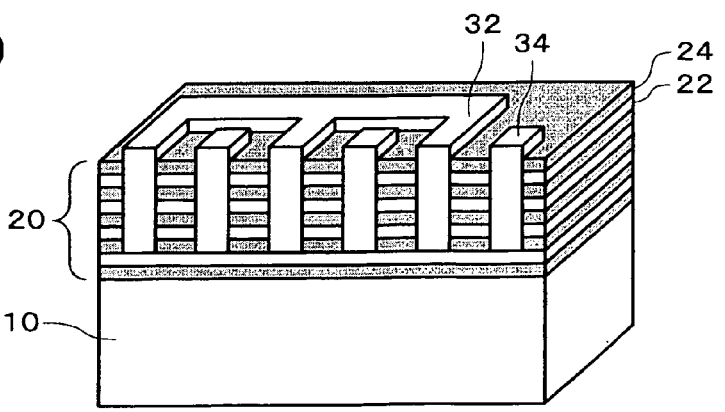

First, as shown in FIG. 6A, high refractive index layers 22 composed of semiconductor and semiconductor layers 23 that become low refractive index layers 24 in a post-processing are alternately grown by epitaxial growth on a semiconductor substrate 10 to form a multilayer film 25. For example, a MBE method and a MOCVD method are enumerated as the epitaxial growth method. Next, as shown in FIG. 6B, to provide an embedding part to form electrodes, the multilayer film 25 is patterned to a given depth, conforming to the shape of the electrodes (for instance, a comb shape). For example, the patterning can be conducted by using RIE (reactive ion etching), etc. In this case, the multilayer film 25 may be etched to a depth that reaches at least up to the point where incidence light is assumed to reach. Next, as shown in FIG. 6C, the semiconductor layers 23 of the multilayer film 25 are selectively oxidized to form the low refractive index layers 24. As a result, the refractive index difference with the high refractive index layers 22 can be made greater, and a photonic crystal structure, with which the group velocity delaying effect can be sufficiently demonstrated even with a few numbers of layers, can be manufactured. Last, as shown in FIG. 6D, electrode material composed of metal is deposited in the patterned part of the multilayer film 20 after the selective oxidation by using a sputter-deposition method, or the like, whereby the photodetector of the present exemplary embodiment can be obtained.

Exemplary Embodiment 1

As an exemplary embodiment of the photodetector of the present invention, a case in which a multilayer film formed from $GaAs/Al_xO_y$ is used is described below.

Figure 7:
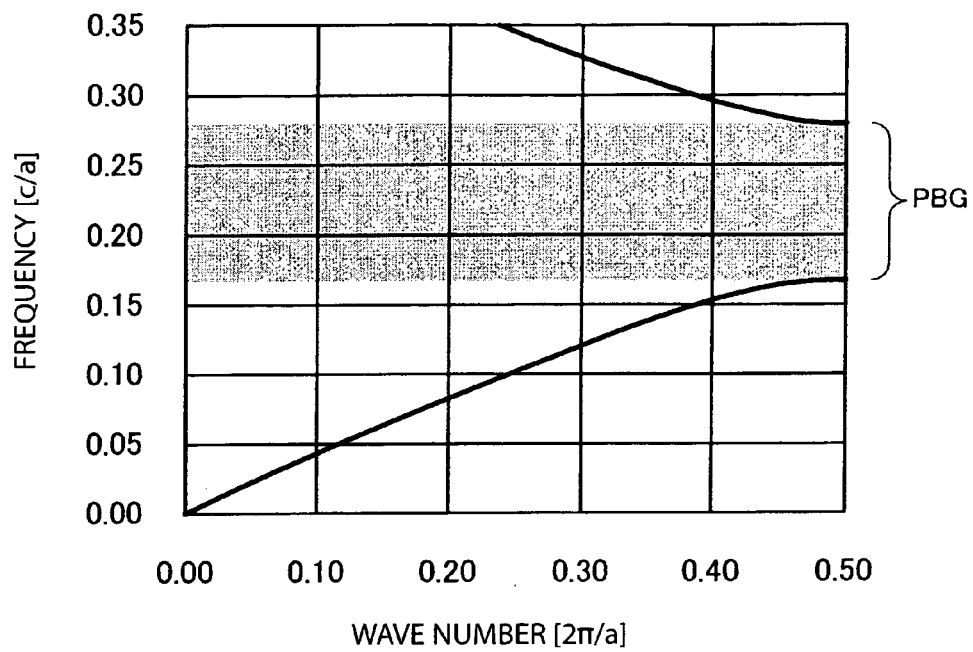
FIG. 7 shows a schematic for describing a photonic band structure of a multilayer film in accordance with exemplary embodiment 1.

First, manufacturing of the device is described. This is conducted according to the procedure indicated in FIG. 6A–FIG. 6D. First, a GaAs/AlAs multilayer film is grown on a GaAs substrate. The unit cycle length of the multilayer film is set such that the absorption band of the GaAs layer that becomes a photoabsorption layer in the low group velocity wavelength region is included in the photonic band structure of the $GaAs/Al_xO_y$ multilayer film shown in FIG. 7. In FIG. 7, a is the thickness of one pair (unit cycle of the photonic crystal), and c is a velocity of light. The multilayer film may be formed in a manner that the thickness of each of the films is gradually changed in the wavelength region that causes the reduced group velocity, so that the group velocity may gradually become smaller. In any case, the length of unit cycle and the number of unit cycles in the multilayer film are determined such that wavelengths that demonstrate at the maximum the Fabry-Perot effect and the effect delaying the group velocity of light which is determined by the group velocity lowering effect at the band edge of the photonic band of the multilayer film eventually match with the absorption wavelengths of the photoabsorption layers.

In the present exemplary embodiment, the wavelength to be absorbed in the photoabsorption layer is assumed to be 850 nm by which GaAs layers most efficiently absorb. When the incidence light of a 850 nm band is to be delayed by the band edge on the long wavelength side of a photonic region of the $GaAs/Al_xO_y$ infinite periodic multilayer film shown in FIG. 7, it is understood that the length a of the unit cycle may be made to be about 144 nm because the normalization frequency is required to be only about 0.17 [c/a].

Also, considering cases in which, for example, two multilayer films with different unit cycle lengths (the unit cycle lengths are $a_1$ and $a_2$, respectively) and the same number of unit cycles that is 16 pairs are used in the structure having a plurality of multilayer films staked in layers as shown in FIG. 3 to receive and spectrally separate incidence light with wavelengths λ1 and λ2. In this case, to adjust the light frequency $f=f_0c/a=0.166$ c/a that can obtain the delaying effect most in the multilayer film of 16 pairs shown in FIG. 9 to λ1, the length $a_1$ of the unit cycle may be designed so that the relation of $a_1=f_0λ1$ is established based on $λ1=c/f=c/(f_0c/a_1)=a_1/f_0$. Based on a similar idea, the length $a_2$ of the unit cycle of the other multilayer film may be designed to be $a_2=f_0λ2$. Therefore, when assuming λ1=850 nm and λ2=855 nm, for example, $a_1$=0.166×850 nm=141 nm, and $a_2$=0.166×855 nm=142 nm maybe provided. Specifically, when light is received while spectrally separating its wavelengths by a plurality of multilayer films, it only has to change the length of the unit cycle in proportion to the wavelength of light to be absorbed by each of the multilayer films.

Next, a portion of the multilayer films where electrodes are scheduled to be formed is etched. Then, the AlAs layers are selectively oxidized to form $GaAs/Al_xO_y$ multilayer films. Last, electrode material is embedded in the part cut by etching to thereby form opposing electrodes in a comb shape.

Figure 8:
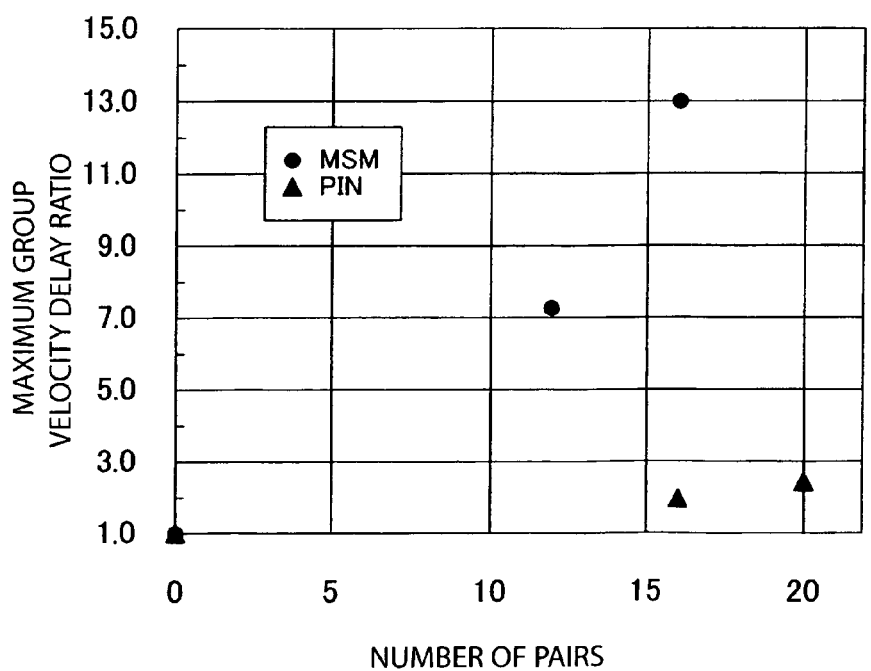
FIG. 8 shows the relation between the number of pairs in the multilayer film and the group velocity delay in accordance with exemplary embodiment 1.

Next, the relation between the group velocity delay at the band edge of the photonic band (ratio of the group velocity delay to the bulk of GaAs) and the reflectance of the multilayer film is described. FIG. 8 shows the relation between the number of pairs in the multilayer film (the number of unit cycles) and the group velocity delay. For comparison, the relation in the case of a PIN-type photodiode is also shown in the same figure (a multilayer film of $Al_{0.1}Ga_{0.9}As/Al_{0.9}Ga_{0.1}As$ is assumed). It is understood from FIG. 8 that the MSM type photodiode ($GaAs/Al_xO_y$) of the present exemplary embodiment can obtain about 7.4 times longer delay in the case of 12 pairs and about 13 times longer delay in the case of 16 pairs. By using oxide films in the MSM type photodiode, it is understood that a large refractive index difference between the high refractive index layers and the low refractive index layers that form the multilayer film can be secured, and a greater group velocity delay can be obtained by a fewer number of pairs than that of the PIN-type photodiode.

Figure 9:
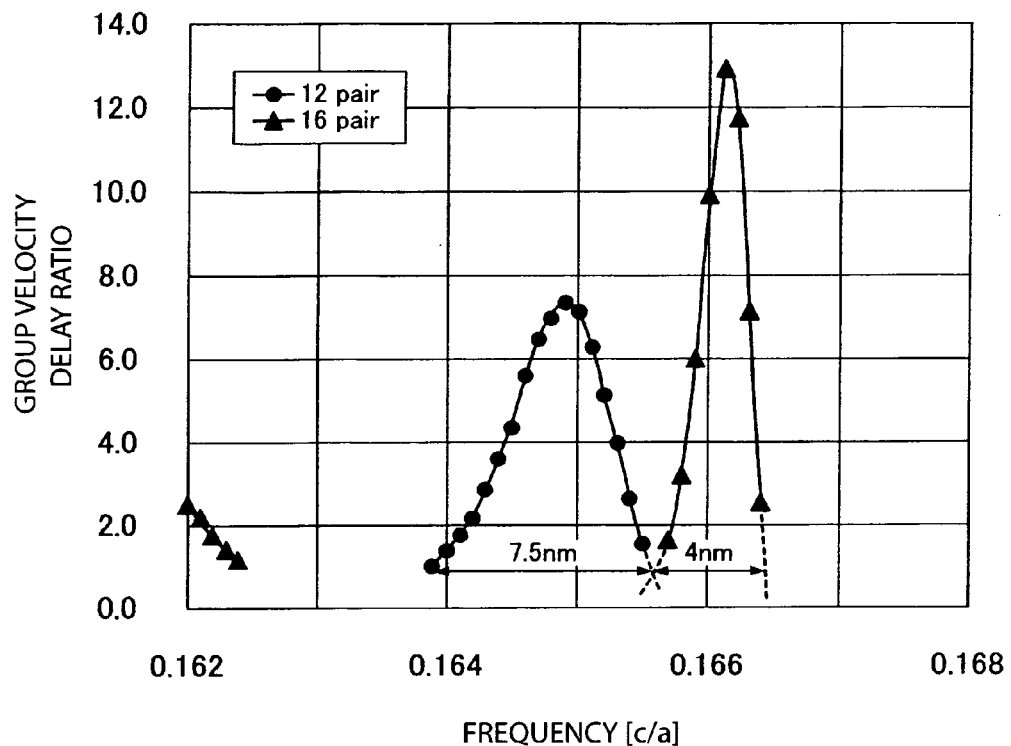
FIG. 9 shows the relation between the optical frequency and the group velocity delay in accordance with exemplary embodiment 1.
Figure 10A:
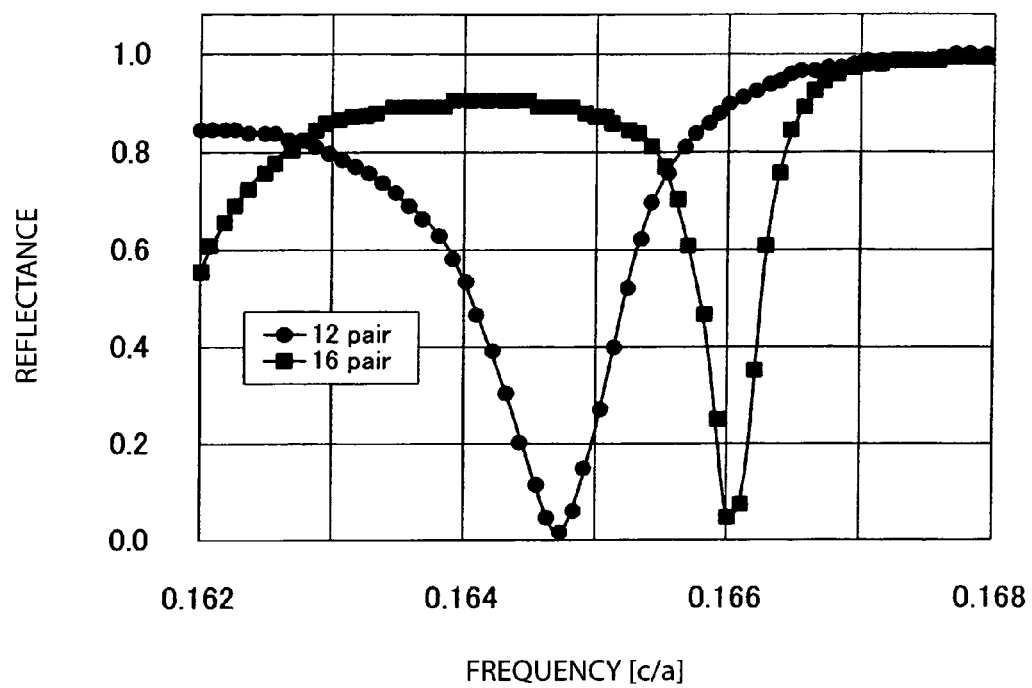
FIGS. 10A and 10B show the relation between the optical frequency and the reflectance of the multilayer film in accordance with the exemplary embodiment 1.
Figure 10B:
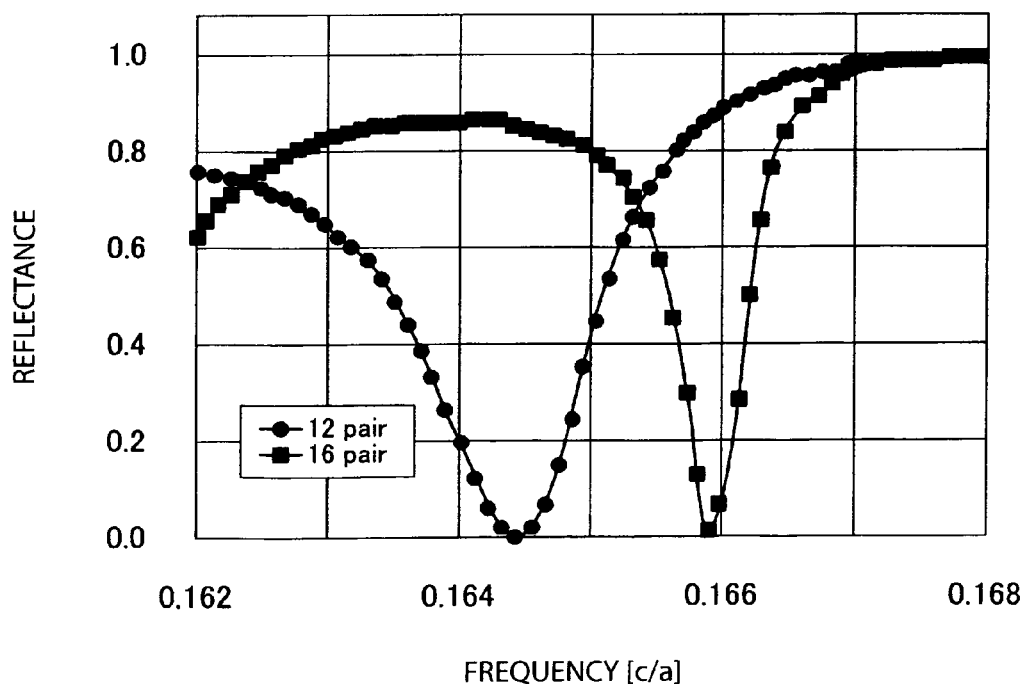

Next, the frequency spectrum of the group velocity delay is shown in FIG. 9. According to FIG. 9, steep frequency selectivity (wavelength-selectivity) for the group velocity delay can be given by increasing the number of pairs in each multilayer film. Also, as the number of pairs in the multilayer film is increased, the group velocity delay band shifts to the high frequency side (low-wavelength side) (approaches to an infinite cycle shown in FIG. 7). Therefore it is necessary to design the unit cycle such that a target wavelength matches with a frequency with the greatest group velocity delaying effect. Also, the frequency spectrum of reflectance is shown in FIG. 10A and FIG. 10B. It is understood from FIG. 10A and FIG. 10B that reflectance becomes considerably small at the frequencies with the large group velocity delay indicated in FIG. 9. This is because the group velocity delay effect indicated in FIG. 9 is determined by the combination of the Fabry-Perot effect and the group velocity lowering effect of the multilayer film. Accordingly, the optical frequency region with a large group velocity delay shown in FIG. 9 always matches with the low reflectance region of FIG. 10A and FIG. 10B, and incidence light can be taken in the multilayer films with a low loss, and at the same time, the light receiving efficiency can be improved. Moreover, as shown in FIG. 10B, when the end layer of the multilayer film is formed with an $Al_xO_y$ layer with its thickness being adjusted so that it functions as an antireflection (AR) coat for incidence light, the reflectance can be further decreased, and the incidence light can be taken in the multilayer film with much lower loss.

Figure 11:
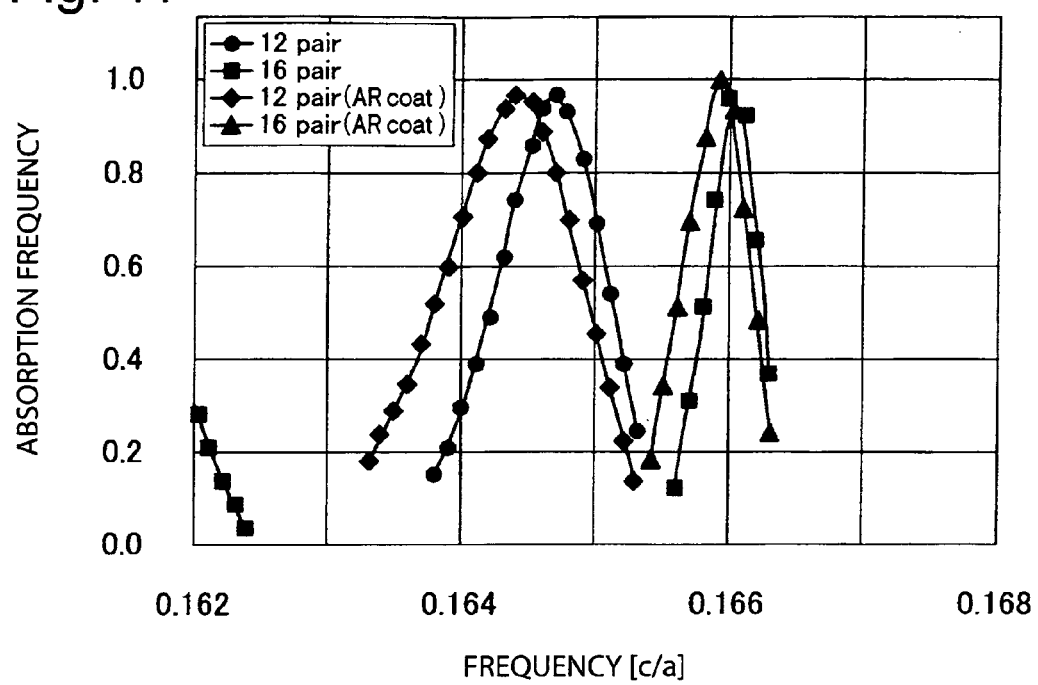
FIG. 11 shows the relation between the optical frequency and the absorbing efficiency of the multilayer film in accordance with the exemplary embodiment 1.

Last, the result of calculating the final efficiency η is shown in FIG. 11, considering that the $Al_xO_y$ layer does not absorb light of a 850 nm band.

$$\eta \cong (1-R)\left(1 - \frac{n_{ph}}{n_{ph}(0)}\right) = (1-R)\left(1 - \exp\left(-\alpha \frac{v_g}{v_g'}l\right)\right) \quad \text{Formula 1}$$

Here, R is reflectance, l is the thickness of the absorbing layer, vg is a group velocity in the GaAs bulk, and vg' is a group velocity in the optical delaying film. The absorption coefficient α uses a typical value of $10^4$ cm$^{-1}$ in a 850 nm band of the absorbing layer (GaAs). It is understood from FIG. 11 that, when a plurality of multilayer films shown in FIG. 3 are provided, light can be received while its wavelengths being spectrally separated at intervals of a half-width of about 3.5 nm. However, to stack multilayer films in multiple stages, each of the multilayer films needs to be formed such that a wavelength region of a high absorption efficiency matches not with a wavelength region with a high reflectance caused by the photonic band gap, but with a wavelength region in which the group velocity is delayed at band ends adjacent to the wavelength band with a high reflectance. In order to make the photodetector in accordance with the present exemplary embodiment to efficiently perform wavelength spectral separation, absorption of wavelengths with a few delays may be reduced, and, for example, multilayer films formed with $Si/SiO_2$ using indirect transition type semiconductor are useful for multiple stage compositions.

2. Optical Module

FIG. 12 shows an optical module that applies the photodetector of the present exemplary embodiment.

Figure 12A:
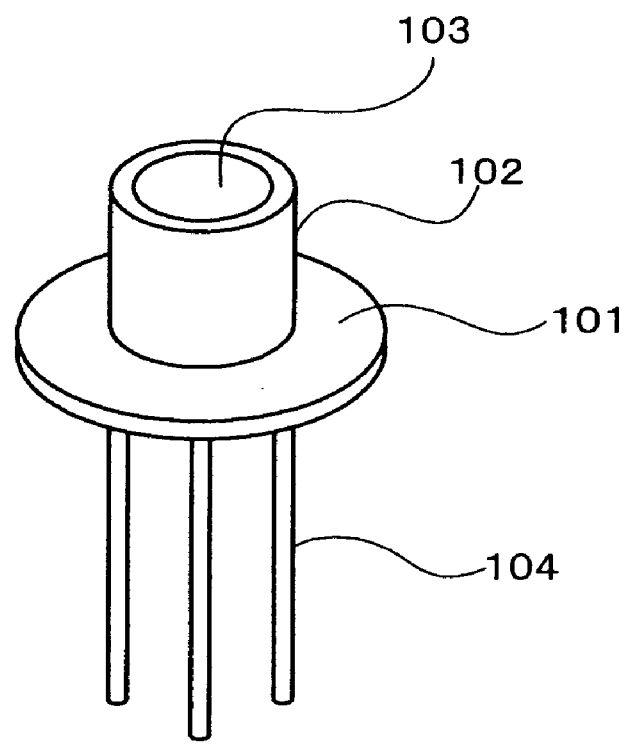
FIGS. 12A and B are schematics showing an external view and a cross-sectional view of an optical module in accordance with an exemplary embodiment of the present invention.
Figure 12B:
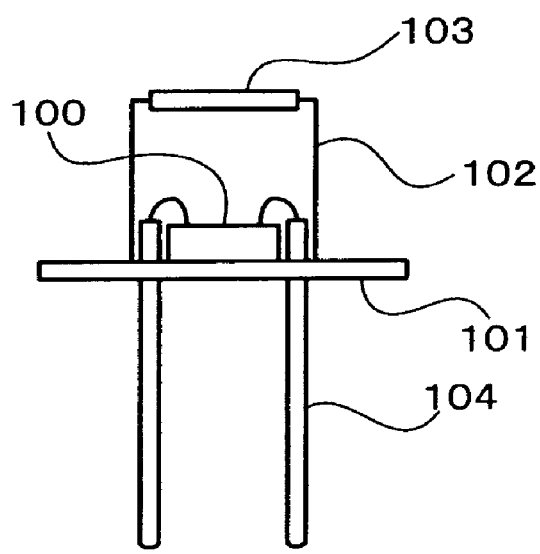

As shown in FIG. 12A, the optical module is a so-called CAN package type optical module, which includes a container 102 that is connected to (or formed in one piece with) a metallic stem 101, and leads 104 provided in a manner to project on the opposite side of the metallic container 102. The container 102 is provided on its upper surface with a light receiving window 103 made of glass to take in incidence light. FIG. 12B is a schematic of the optical module of the present exemplary embodiment. In the container 102, a MSM type photodetector 100 of the present exemplary embodiment is arranged on the stem 101, and its electrodes are connected to the leads 104 by bonding wires or the like. It is noted that the photodetector 100 may be provided on the stem 101 through a metallic submount. In this optical module, incidence light can be taken in through the light receiving window 103, and optical signals are converted into electric signals by the photodetector 100, which can be taken out from the leads 104. As the optical module of the present exemplary embodiment, it is not limited to the CAN package type shown in FIG. 12A, and may be a SMD (surface mounting device) type, an optical connector all-in-one type, or an optical module of the pigtail type with an optical fiber being connected to its tip section.

3. Optical Transmission Device

Figure 13:
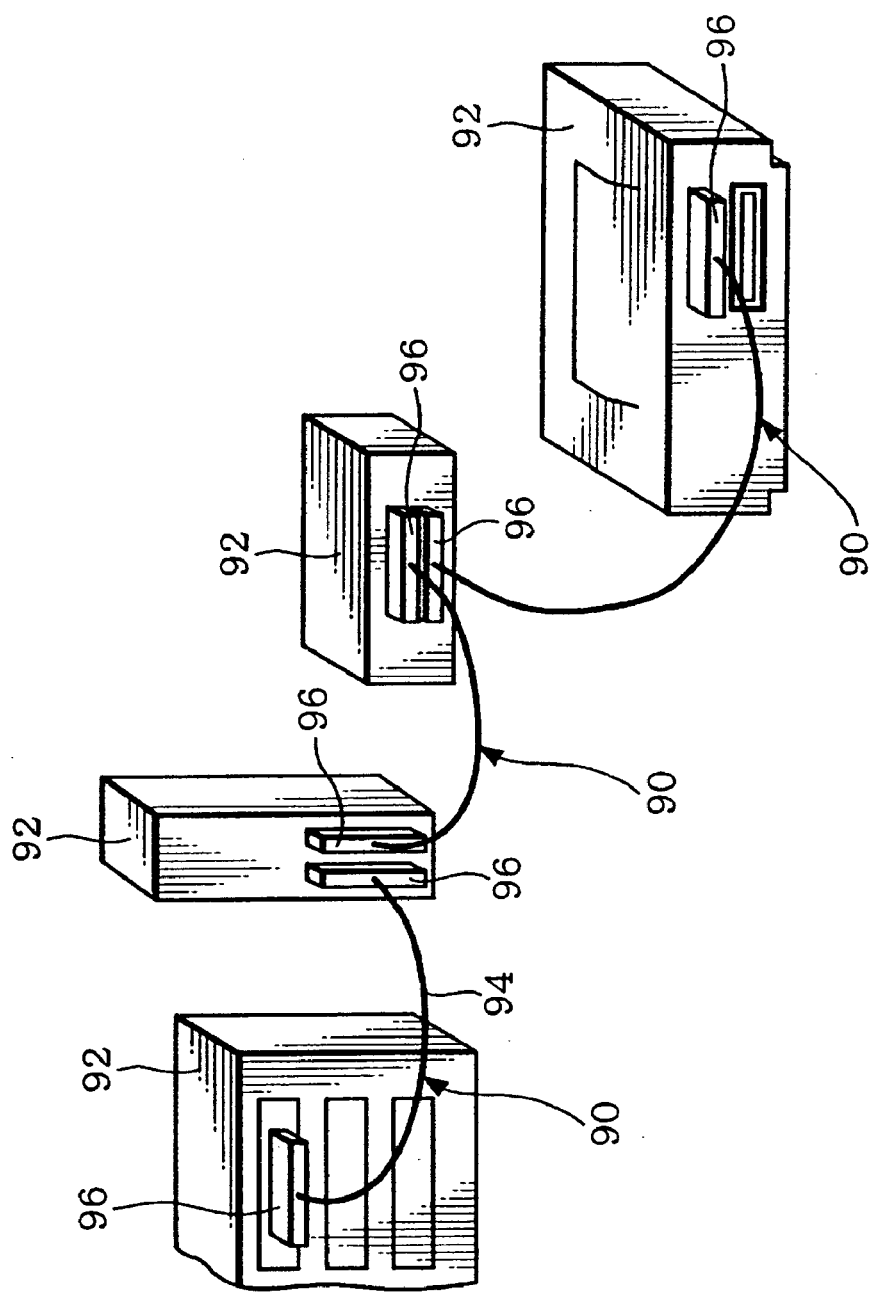
FIG. 13 is a schematic showing an optical transmission device in accordance with an exemplary embodiment of the present invention.

FIG. 13 is a schematic showing optical transmission devices in accordance with an exemplary embodiment of the present invention.

The optical transmission devices 90 mutually connect electronic devices 92, such as a computer, display device, storage device, printer and the like. The electronic devices 92 may be information communication devices. The optical transmission device 90 may include a cable 94 and plugs 96 provided on both sides of the cable 94. Specifically, the cables 94 may be multimode optical fibers. The plugs 96 are composed with the optical modules of the present exemplary embodiment included therein as photodetectors to receive signals. With this optical transmission device, data can be transmitted among the electronic devices by optical signals.

Electronic devices that are mutually connected by the optical transmission device of the present exemplary embodiment include, for example, liquid crystal display monitors, digital CRTs (which may be used in the fields of finance, mail order, medical treatment, and education), liquid crystal projectors, plasma display panels (PDP), digital TVs, cash registers of retail stores (for POS), videos, tuners, gaming devices, printers and the like.

The preferred exemplary embodiments of the present invention are described above. However, the present invention is not limited to the above described exemplary embodiments, and can be executed while making various modifications within the scope of the subject matter of the present invention.

What is claimed is:

1. A photodetector having a MSM (Metal-Semiconductor-Metal) structure, comprising:
a substrate;
a multilayer film that is disposed over the substrate and includes a low refractive index layer and a high refractive index layer that are alternately laminated as a unit cycle, at least one of the low refractive index layer and the high refractive index layer being a photoabsorption layer composed of semiconductor;
a first electrode having a portion embodied in the multilayer film; and
a second electrode having a portion embodied in the multilayer film, the portion of the second electrode opposite the portion of the first electrode,
the multilayer film being formed such that a wavelength region corresponding to a band edge of a photonic band overlaps at least a part of an absorption band of the photoabsorption layer, thereby delaying a group velocity of incidence light with a predetermined wavelength that belongs to the absorption band of the photoabsorption layer.

2. The photodetector according to claim 1,
a plurality of the multilayer films being stacked on the substrate,
a plurality of the first electrodes and second electrodes being provided for the plurality of the multilayer films, and
the plurality of the multilayer films being formed such that band edges of photonic bands differ from one another to delay group velocities of light having different wavelengths.

3. The photodetector according to claim 2, ends of photonic band gaps in a long-wavelength side of the plurality of multilayer films shifting in stages toward the long-wavelength side from a light incidence surface side to a side of the substrate.

4. The photodetector according to claim 2, ends of the photonic band gaps in a short-wavelength side of the plurality of multilayer films shifting in stages toward the short-wavelength side from of the light incidence surface side to the side of the substrate.

5. The photodetector according to claim 1, an end layer of the multilayer film on the light incidence surface side being the low refractive index layer, and the end layer being formed to have a layer thickness that is set so as not to reflect the incidence light.

6. The photodetector according to claim 1, the photoabsorption layer being an indirect transition type semiconductor.

7. The photodetector according to claim 1, the low refractive index layer consisting of one of oxide and nitride.

8. The photodetector according to claim 1, further comprising:
a multilayer reflection film between the multilayer film and the substrate.

9. The photodetector according to claim 1, the first electrode and the second electrode having a planar configuration in a comb shape.

10. An optical module, comprising:
a photodetector according to claim 1.

11. An optical transmission device comprising:
an optical module according to claim 10.

* * * * *